(12) United States Patent
Otsubo

(10) Patent No.: US 10,555,421 B2
(45) Date of Patent: Feb. 4, 2020

(54) COMPONENT-EMBEDDED RESIN SUBSTRATE AND METHOD FOR MANUFACTURING SAME

(71) Applicant: Murata Manufacturing Co., Ltd., Kyoto-fu (JP)

(72) Inventor: Yoshihito Otsubo, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 168 days.

(21) Appl. No.: 14/041,572

(22) Filed: Sep. 30, 2013

(65) Prior Publication Data

US 2014/0030471 A1    Jan. 30, 2014

Related U.S. Application Data

(63) Continuation of application No. PCT/JP2012/057890, filed on Mar. 27, 2012.

(30) Foreign Application Priority Data

Apr. 1, 2011 (JP) ................. 2011-082069

(51) Int. Cl.
H05K 3/28 (2006.01)

(52) U.S. Cl.
CPC ........ H05K 3/284 (2013.01); *Y10T 156/1056* (2015.01); *Y10T 428/23* (2015.01); *Y10T 428/239* (2015.01)

(58) Field of Classification Search
CPC ... Y10T 428/23; Y10T 428/239; H05K 3/284; H05K 1/183; H05K 1/186
USPC ................................. 428/76, 26
See application file for complete search history.

(56) References Cited

U.S. PATENT DOCUMENTS

| | | | | |
|---|---|---|---|---|
| 5,179,435 A | * | 1/1993 | Usui ........................... | 257/758 |
| 2004/0245653 A1 | * | 12/2004 | Lee ..................... | H01L 23/4334 |
| | | | | 257/778 |
| 2007/0044910 A1 | * | 3/2007 | Kuo ....................... | B32B 15/08 |
| | | | | 156/307.3 |

FOREIGN PATENT DOCUMENTS

| | | | | |
|---|---|---|---|---|
| JP | 2001-320146 A | 11/2001 | | |
| JP | 2007-305674 A | 11/2007 | | |
| JP | 2008-159973 A | 7/2008 | | |
| JP | 2009-218441 A | 9/2009 | | |
| JP | 2009-224401 A | * 10/2009 | .............. | H05K 3/46 |
| JP | 2009-224401 A | 10/2009 | | |
| JP | 2009224401 A | * 10/2009 | | |

(Continued)

OTHER PUBLICATIONS

English machine translation of JP2009-224401 from JPO dated Oct. 2009.*

(Continued)

*Primary Examiner* — Frank J Vineis
*Assistant Examiner* — Laura B Figg
(74) *Attorney, Agent, or Firm* — Pearne & Gordon LLP

(57) ABSTRACT

A component-embedded resin substrate (1) includes a plurality of resin layers (2) made of a first resin and laminated on one another, and a component (3) arranged to be surrounded by each resin layer (2) in a first group (8) which is a group of two or more resin layers arranged successively in a thickness direction included in the plurality of resin layers (2). An auxiliary resin portion (9) made of a second resin different from the first resin is arranged to be in contact with and along at least one of surfaces of the component (3).

19 Claims, 10 Drawing Sheets

(56) References Cited

FOREIGN PATENT DOCUMENTS

| JP | 2010-21368 A | | 1/2010 |
|---|---|---|---|
| JP | 2010021368 A | * | 1/2010 |
| TW | 200709751 | | 3/2007 |

OTHER PUBLICATIONS

JPlat Pat machine English translation of JP2009-224401, published Oct. 2009.*
JPlat Pat machine English Translation of JP2010-021368, published Jan. 2010.*
J Plat Pat machine English translation of JP2009-224401 (Year: 2009).*
International Search Report for Application No. PCT/JP2012/057890 dated May 15, 2012.
Written Opinion of the International Searching Authority for Application No. PCT/JP2012/057890 dated May 15, 2012.

* cited by examiner

COMPONENT-EMBEDDED RESIN SUBSTRATE AND METHOD FOR MANUFACTURING SAME

BACKGROUND OF THE INVENTION

Field of the Invention

The present invention relates to a component-embedded resin substrate and a method for manufacturing the same.

Description of the Related Art

An example of a component-embedded substrate formed by alternately laminating insulating layers made of a thermoplastic resin and conductive patterns is described in Japanese Patent Laying-Open No. 2007-305674 (PTD 1). According to this document, an electronic component such as a chip resistor is embedded within the substrate, and is connected to another electronic component via wiring. In the component-embedded substrate, a member called a via conductor is formed to penetrate an insulating layer in a thickness direction in order to electrically connect conductive patterns provided at different heights. The electronic component is completely covered within the component-embedded substrate, and is surrounded by some of a plurality of insulating layers. In the layers at a height where the electronic component is arranged, the insulating layers made of a thermoplastic resin completely surround an outer periphery of the electronic component to be directly and closely in contact with the outer periphery of the electronic component.

FIG. 29 shows an example of a component-embedded resin substrate in accordance with a conventional technique. In this example, within a component-embedded resin substrate 901, resin layers 2 as insulating layers completely surround an outer periphery of a component 3 as an electronic component to be directly and closely in contact with the outer periphery of component 3. Component-embedded resin substrate 901 includes a plurality of via conductors 6 and a plurality of conductive patterns 7 therein. As shown in FIG. 30, component 3 is a rectangular parallelepiped, and has electrodes 3a, 3b at both end portions. As shown in FIG. 29, via conductors 6n are connected to electrodes 3a, 3b of component 3.

PTD 1: Japanese Patent Laying-Open No. 2007-305674

BRIEF SUMMARY OF THE INVENTION

The above component-embedded resin substrate has a problem that, when the substrate itself is deformed, a resin layer may peel off around the embedded component. For example, in the structure shown in FIG. 29, there is a possibility that, within component-embedded resin substrate 901, an interface 4 where resin layers 2 as insulating layers abut on component 3 firstly peels off, and a crack runs in an interface 5 between resin layers 2, starting from the peel-off portion of interface 4.

Accordingly, one object of the present invention is to provide a component-embedded resin substrate which alleviates the problem that a resin layer peels off around an embedded component even when the substrate itself is deformed, and a method for manufacturing the same.

To achieve the aforementioned object, a component-embedded resin substrate in accordance with the present invention includes a plurality of resin layers made of a first resin and laminated on one another, and a component arranged to be surrounded by each resin layer in a first group which is a group of two or more resin layers arranged successively in a thickness direction included in the plurality of resin layers, and an auxiliary resin portion made of a second resin different from the first resin is arranged to be in contact with and along at least one of surfaces of the component. By adopting this configuration, the auxiliary resin portion made of the second resin different from the first resin is arranged, and thus the problem that a resin layer peels off around the embedded component can be alleviated even when the substrate itself is deformed.

Preferably, in the above invention, the second resin has a Young's modulus higher than that of the first resin. By adopting this configuration, the auxiliary resin portion readily contributes to an increase in stiffness around a periphery of the component, and thus the problem that a resin layer peels off around the embedded component can be alleviated efficiently.

Preferably, in the above invention, the auxiliary resin portion is arranged to cover a side surface of the component. By adopting this configuration, the auxiliary resin portion can receive a force applied from the side of the component, and thus the problem that a resin layer peels off around the embedded component can be alleviated more effectively.

Preferably, in the above invention, the auxiliary resin portion is arranged to span all of the first group with respect to the thickness direction. By adopting this configuration, stiffness around the periphery can be increased more reliably.

Preferably, in the above invention, the auxiliary resin portion includes a portion arranged to surround a periphery of the component as seen in planar view. By adopting this configuration, stiffness around the periphery of the component can be increased more reliably.

Preferably, in the above invention, the component has a first main surface parallel to surfaces of the resin layers, and the auxiliary resin portion is arranged to cover the first main surface of the component. By adopting this configuration, the auxiliary resin portion can receive a force acting on the component more reliably, and thus the problem that a resin layer peels off around the embedded component can be alleviated more effectively.

Preferably, in the above invention, the component has a second main surface parallel to the first main surface on a side opposite to the first main surface, and the auxiliary resin portion is arranged to further cover the second main surface. By adopting this configuration, of the surfaces of the component, both front and rear portions which account for a particularly large percentage are covered with and protected by the auxiliary resin portion, and thus a certain effect can be obtained on the problem that a resin layer peels off around the embedded component.

Preferably, in the above invention, the auxiliary resin portion has a shape of a cap surrounding an upper surface and a periphery of the component. By adopting this configuration, stiffness around the periphery of the component can be increased more reliably, and thus the peeling-off of a resin layer can be suppressed.

Preferably, in the above invention, the auxiliary resin portion is arranged to cover a side surface of the component, and, in a portion where the auxiliary resin portion covers the side surface, an outer side surface of the auxiliary resin portion has a central portion in the thickness direction which is recessed from upper and lower portions in the thickness direction. By adopting this configuration, a force applied from the component does not concentrate on an interface between adjacent resin layers and a peel force between the resin layers is less likely to be transmitted, and thus the peeling-off of a resin layer can be suppressed more effectively.

Preferably, in the above invention, the first resin is a thermoplastic resin, and the second resin is a thermosetting resin. By adopting this configuration, the peeling-off of a resin layer can be suppressed more reliably.

To achieve the aforementioned object, a method for manufacturing a component-embedded resin substrate in accordance with the present invention includes the steps of: preparing a plurality of resin layers made of a first resin; forming a through hole for accommodating a component in some of the plurality of resin layers; arranging the component in the through hole; arranging an auxiliary resin portion made of a second resin different from the first resin to be in contact with and along at least one of surfaces of the component; laminating the plurality of resin layers; and thermally compression-bonding the laminated plurality of resin layers. By adopting this method, the auxiliary resin portion made of the second resin different from the first resin is arranged to be in contact with and along at least one of the surfaces of the component, and thus a component-embedded resin substrate in which a resin layer is less likely to peel off around an embedded component can be obtained.

Preferably, in the above invention, the second resin has a Young's modulus higher than that of the first resin. By adopting this method, the auxiliary resin portion contributes to an increase in stiffness around a periphery of the component, and thus a component-embedded resin substrate in which a resin layer is less likely to peel off around an embedded component can be obtained.

Preferably, in the above invention, in the step of arranging the auxiliary resin portion, the auxiliary resin portion is arranged to surround a periphery of the component as seen in planar view. By adopting this method, a configuration in which the auxiliary resin portion covers any of the sides of the component as seen in planar view is obtained, and thus a component-embedded resin substrate in which a resin layer is less likely to peel off around an embedded component can be obtained.

Preferably, in the above invention, in the step of arranging the auxiliary resin portion, the auxiliary resin portion is arranged to cover a side surface of the component. By adopting this method, the side surface of the component is protected by the auxiliary resin portion, and thus a component-embedded resin substrate in which a resin layer is less likely to peel off around an embedded component can be obtained.

Preferably, in the above invention, the component has a first main surface parallel to surfaces of the resin layers, and the auxiliary resin portion is arranged to cover the first main surface of the component. By adopting this method, at least one main surface of the component is protected by the auxiliary resin portion, and thus a component-embedded resin substrate in which a resin layer is less likely to peel off around an embedded component can be obtained.

Preferably, in the above invention, the component has a second main surface parallel to the first main surface on a side opposite to the first main surface, and the auxiliary resin portion is arranged to further cover the second main surface. By adopting this method, both front and rear main surfaces of the component are protected by the auxiliary resin portion, and thus a component-embedded resin substrate in which a resin layer is less likely to peel off around an embedded component can be obtained.

Preferably, in the above invention, the auxiliary resin portion is prepared to have a shape of a cap surrounding an upper surface and a periphery of the component, and the method includes the step of arranging the auxiliary resin portion to cover the upper surface and the periphery of the component. By adopting this method, stiffness around the periphery of the component can be increased more reliably, and thus the peeling-off of a resin layer can be suppressed.

Preferably, in the above invention, the auxiliary resin portion is arranged to cover a side surface of the component, and, in a portion where the auxiliary resin portion covers the side surface, the auxiliary resin portion is arranged such that an outer side surface of the auxiliary resin portion has a central portion in the thickness direction which is recessed from upper and lower portions in the thickness direction. By adopting this method, a component-embedded resin substrate in which a resin layer is less likely to peel off around an embedded component can be obtained.

Preferably, in the above invention, the first resin is a thermoplastic resin, and the second resin is a thermosetting resin, and the method includes the step of performing heat treatment for hardening the second resin after finishing both the step of arranging the component and the step of arranging the auxiliary resin portion. By adopting this method, in the step of thermally compression-bonding the laminated plurality of resin layers, the second resin arranged on the periphery of the component has already been hardened. Therefore, the second resin serves as a hard wall for protecting the component, and the component is further less likely to be damaged.

DETAILED DESCRIPTION OF THE INVENTION (Embodiment 1)

Figure 1:
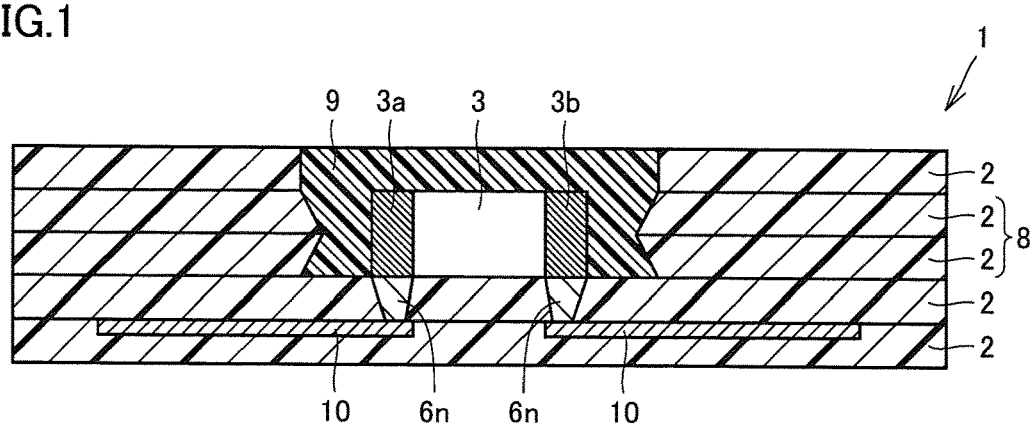
FIG. 1 is a cross sectional view of a component-embedded resin substrate in Embodiment 1 in accordance with the present invention.
Figure 2:
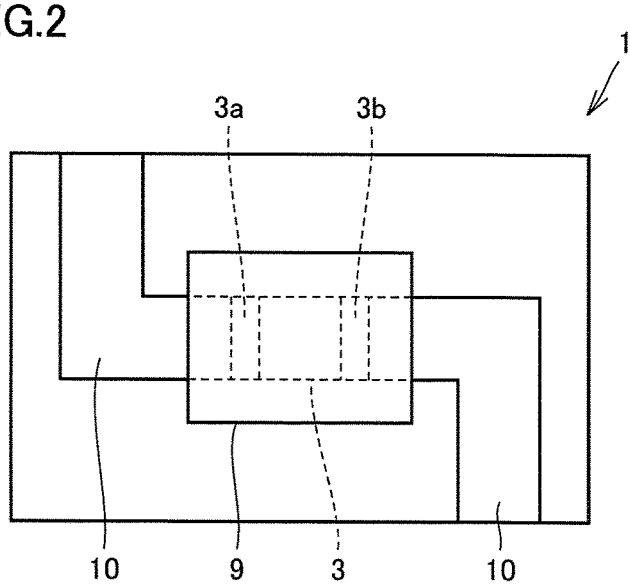
FIG. 2 is a perspective view showing a planar positional relationship among a component, an auxiliary resin portion, and a wiring pattern included in the component-embedded resin substrate in Embodiment 1 in accordance with the present invention.
Figure 29:
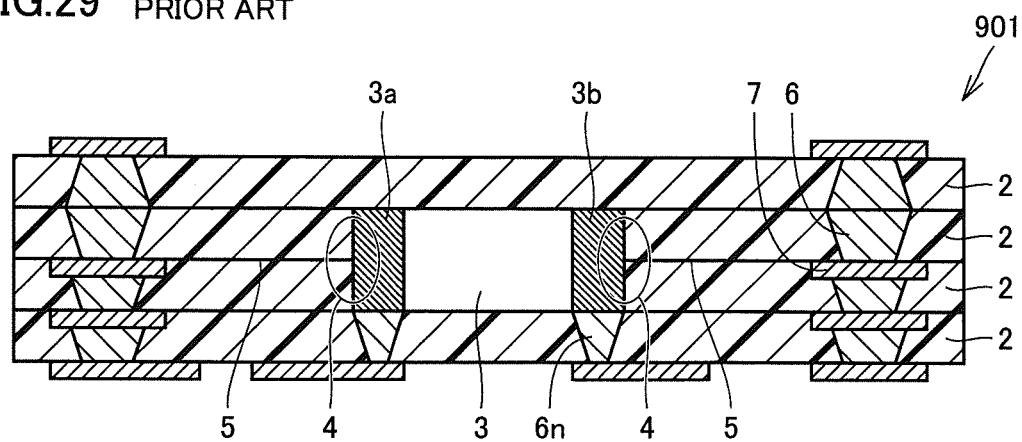
FIG. 29 is a cross sectional view of a component-embedded resin substrate in accordance with a conventional technique.

A component-embedded resin substrate 1 in Embodiment 1 in accordance with the present invention will be illustrated with reference to FIGS. 1 and 2. FIG. 1 shows a cross sectional view of component-embedded resin substrate 1 in the present embodiment. FIG. 2 shows a planar positional relationship among a component 3, an auxiliary resin portion 9, and a wiring pattern 10 within component-embedded resin substrate 1. In FIG. 2, an internal structure is partially seen through. Although FIGS. 1 and 2 do not show via conductors 6 and conductive patterns 7 arranged within component-embedded resin substrate 1, component-embedded resin substrate 1 may include via conductors 6 and conductive patterns 7 as appropriate, as with component-embedded resin substrate 901 shown in FIG. 29. Via conductor 6 may be formed by, for example, filling a through hole opened by laser processing with a conductive paste containing silver, and hardening the conductive paste. Conductive pattern 7 may be a pattern formed of, for example, copper foil.

Component-embedded resin substrate 1 in the present embodiment includes a plurality of resin layers 2 made of a first resin and laminated on one another, and component 3 arranged to be surrounded by each resin layer 2 in a first group 8 which is a group of two or more resin layers arranged successively in a thickness direction included in the plurality of resin layers 2. Auxiliary resin portion 9 made of a second resin different from the first resin is arranged to be in contact with and along at least one of surfaces of component 3.

Figure 30:
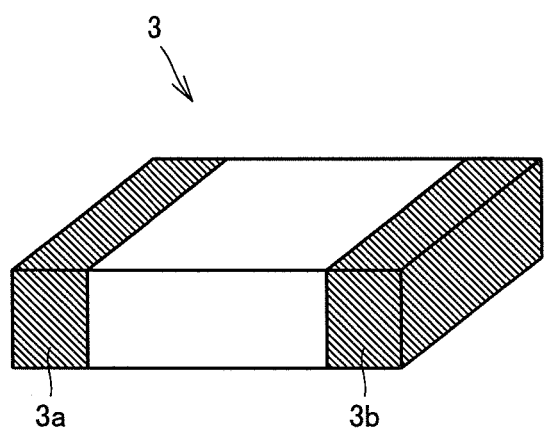
FIG. 30 is a perspective view of one example of a component.

Component 3 included in component-embedded resin substrate 1 is one example of an electronic component. Component 3 has an outer shape of a rectangular parallelepiped as shown in FIG. 30, and includes electrodes 3a, 3b at both end portions. Electrodes 3a, 3b are provided at the both end portions to surround the main body of component 3. Component 3 may be, for example, a ceramic capacitor. Electrodes 3a, 3b are each electrically connected to wiring pattern 10 through via conductor 6n. Although via conductor 6n is drawn downward from component 3 in FIG. 1, this is merely one example, and the direction in which via conductor 6n is drawn is not limited to a downward direction. The member electrically connected to the component may be configured to be drawn in another direction.

As shown in FIG. 2, auxiliary resin portion 9 is arranged to occupy a region larger than a projection region of component 3 as seen in planar view. Auxiliary resin portion 9 is arranged to surround component 3 at the same height as component 3. In FIG. 2, auxiliary resin portion 9 is shown on a side closer to the viewer, and wiring pattern 10 is shown on a side farther from the viewer. As shown in FIG. 1, wiring pattern 10 is located at a height different from that of auxiliary resin portion 9. As shown in FIG. 2, wiring pattern 10 extends outward from the region occupied by auxiliary resin portion 9 as seen in planar view.

Here, while resin layer 2 is made of the first resin and auxiliary resin portion 9 is made of the second resin different from the first resin, each of them is not always purely made of a resin only, and may contain a filler. The expression "the second resin different from the first resin" not only refers to a case where the second resin is a resin of a type completely different from that of the first resin, but also includes a case where, even though the first resin and the second resin are based on a resin of the same type, the second resin is different from the first resin in at least one of the conditions such as the presence or absence of a mixed filler, a particle size, and a content ratio thereof, etc.

In component-embedded resin substrate 1 in the present embodiment, since auxiliary resin portion 9 made of the second resin different from the first resin is arranged to be in contact with and along at least one of the surfaces of component 3, the problem that a resin layer peels off around the embedded component can be alleviated even when the substrate itself is deformed.

Preferably, the second resin has a Young's modulus higher than that of the first resin, because, in such a case, the auxiliary resin portion readily contributes to an increase in stiffness around a periphery of the component, and thus an excessively large bending of a resin layer around the periphery of the component can be avoided, and peeling-off, which has conventionally been problematic, is less likely to occur. The Young's moduli of the first and second resins can be set as appropriate. For example, if the mixed filler has a small particle size, the resin has a low Young's modulus, and if the mixed filler has a large particle size, the resin has a high Young's modulus. Glass fiber may be mixed as a filler. If a large amount of glass fiber is mixed, the resin has a high Young's modulus. The mixed filler may be metal particles. Even if the filler is metal particles, no problem arises as long as the metal particles are mixed to an extent that a resin material has no conductivity. In particular, when a thermoplastic resin is used as the first resin and a thermosetting resin is used as the second resin, the peeling-off of a resin layer can be suppressed more reliably.

It is noted that the "Young's modulus" referred to in the present invention is measured by ASTM D-790.

In the present embodiment, auxiliary resin portion 9 has both a lower portion arranged to surround the periphery of component 3 as seen in planar view, and an upper portion covering an upper surface of component 3. That is, auxiliary resin portion 9 has a shape of a cap placed over component 3 to enclose component 3 from above. In other words, the auxiliary resin portion preferably has a shape of a cap surrounding the upper surface and the periphery of the component. As shown in the present embodiment, auxiliary resin portion 9 preferably includes a portion arranged to surround the periphery of component 3 as seen in planar view. By adopting this configuration, stiffness around the periphery of the component can be increased more reliably. Since the auxiliary resin portion covers any of the sides of the component as seen in planar view, it can deal with a bending applied from any direction. With such a configuration, the problem that a resin layer peels off around the embedded component can be alleviated more effectively even when the substrate itself is deformed.

Preferably, auxiliary resin portion 9 is arranged to span all of first group 8 with respect to the thickness direction. By adopting this configuration, the auxiliary resin portion is present in an entire region from an upper end to a lower end of the component, and thus stiffness around the periphery thereof can be increased more reliably. This condition is satisfied in the configuration shown in FIG. 1.

Preferably, auxiliary resin portion 9 is arranged to cover a side surface of component 3. By adopting this configuration, the auxiliary resin portion can receive a force applied from the side of the component, and thus the problem that a resin layer peels off around the embedded component can be alleviated more effectively.

Preferably, component 3 has a first main surface parallel to surfaces of resin layers 2, and auxiliary resin portion 9 is arranged to cover the first main surface of component 3. This condition is satisfied in the configuration shown in FIG. 1. In FIG. 1, the upper surface of component 3 corresponds to the first main surface. By adopting this configuration, the auxiliary resin portion can absorb a force acting on the component more reliably, and thus the problem that a resin layer peels off around the embedded component can be alleviated more effectively.

Figure 3:
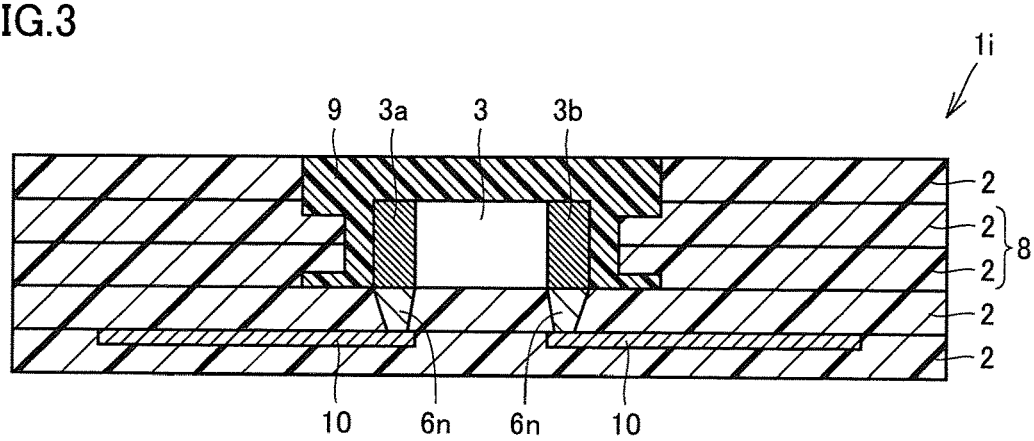
FIG. 3 is a cross sectional view of a first variation of the component-embedded resin substrate in Embodiment 1 in accordance with the present invention.

Preferably, auxiliary resin portion 9 is arranged to cover the side surface of component 3, and, in a portion where auxiliary resin portion 9 covers the side surface, an outer side surface of auxiliary resin portion 9 has a central portion in the thickness direction which is recessed from upper and lower portions in the thickness direction. By adopting this configuration, a force applied from the component does not concentrate on an interface between adjacent resin layers and a peel force between the resin layers is less likely to be transmitted, and thus the peeling-off of a resin layer can be suppressed more effectively. This condition is satisfied in the configuration shown in FIG. 1. Although the outer side surface of auxiliary resin portion 9 is recessed to have a V shape as seen in a cross sectional view in FIG. 1, the outer side surface thereof may be recessed to have a rectangular shape as with auxiliary resin portion 9 in a component-embedded resin substrate 1i shown in FIG. 3, as another example. As shown in FIG. 3, a length of the recess portion in the thickness direction is smaller than a thickness of the component 3, and the recess portion is located below a top surface of the component 3 in the thickness direction.

Figure 4:
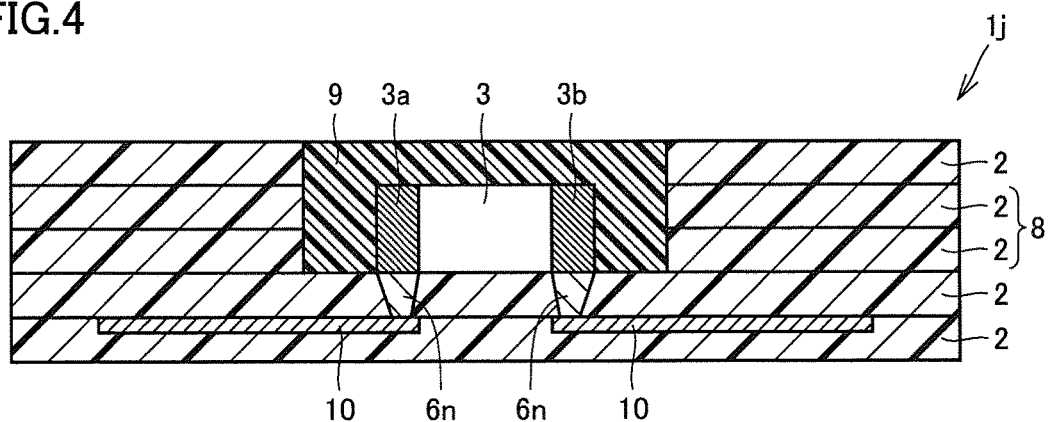
FIG. 4 is a cross sectional view of a second variation of the component-embedded resin substrate in Embodiment 1 in accordance with the present invention.

It is noted that, in a case where the outer side surface of auxiliary resin portion 9 is not recessed as with a component-embedded resin substrate 1j shown in FIG. 4, a certain effect can be obtained on the problem that a resin layer peels off around the embedded component even in this configuration, although the effect may be less than that obtained in a case where the outer side surface of auxiliary resin portion 9 is recessed. Component-embedded resin substrate 1j has an advantage that it is easily fabricated because auxiliary resin portion 9 has a simple shape. Although the outer side surface of auxiliary resin portion 9 is depicted as being perpendicular to the surfaces of resin layers 2 in FIG. 4, it is actually not always perpendicular thereto.

Figure 5:
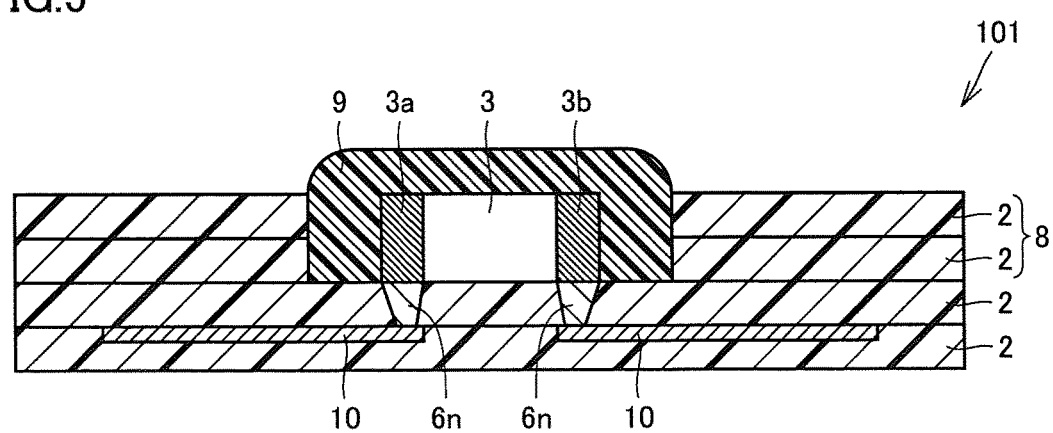
FIG. 5 is a cross sectional view of a third variation of the component-embedded resin substrate in Embodiment 1 in accordance with the present invention.

Further, as a variation of the component-embedded resin substrate to which the present invention is applied, a component-embedded resin substrate such as a component-embedded resin substrate 101 shown in FIG. 5 can also be provided. In component-embedded resin substrate 101, auxiliary resin portion 9 covers the upper surface and the side surface of component 3, and a portion where auxiliary resin portion 9 covers the upper surface of component 3 protrudes upward from an uppermost resin layer 2. Accordingly, the portion where auxiliary resin portion 9 covers the upper surface of component 3 is exposed to the outside. Auxiliary resin portion 9 may be integrally formed by application, and has rounded corners.

Figure 6:
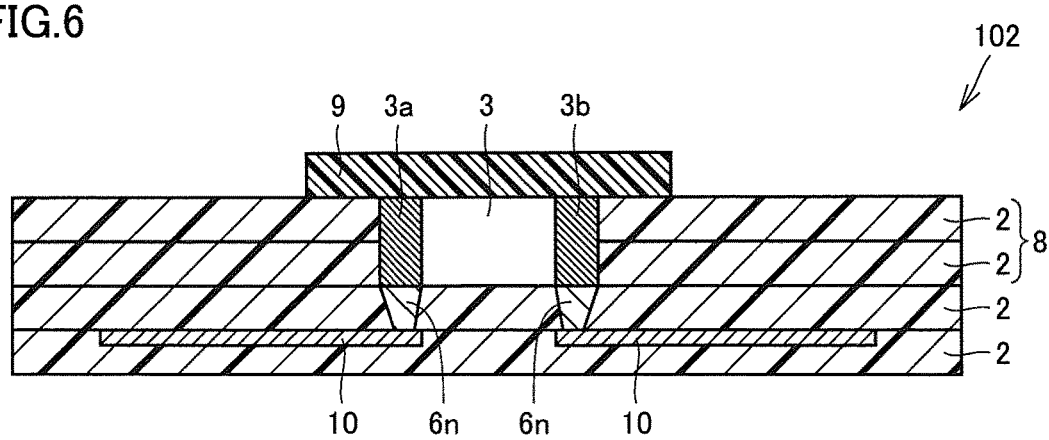
FIG. 6 is a cross sectional view of a fourth variation of the component-embedded resin substrate in Embodiment 1 in accordance with the present invention.

Further, as a variation of the component-embedded resin substrate to which the present invention is applied, a component-embedded resin substrate such as a component-embedded resin substrate 102 shown in FIG. 6 can also be provided. In component-embedded resin substrate 102, auxiliary resin portion 9 covers only the upper surface of component 3. Auxiliary resin portion 9 is arranged to overlie uppermost resin layer 2. An upper surface and a side surface of auxiliary resin portion 9 are exposed to the outside. Even when auxiliary resin portion 9 covers only the upper surface of component 3, stiffness around the periphery of component 3 can be increased, and thus the peeling-off of resin layer 2 can be suppressed. However, it is more preferable that the auxiliary resin portion is arranged on the side surface of component 3.

Figure 7:
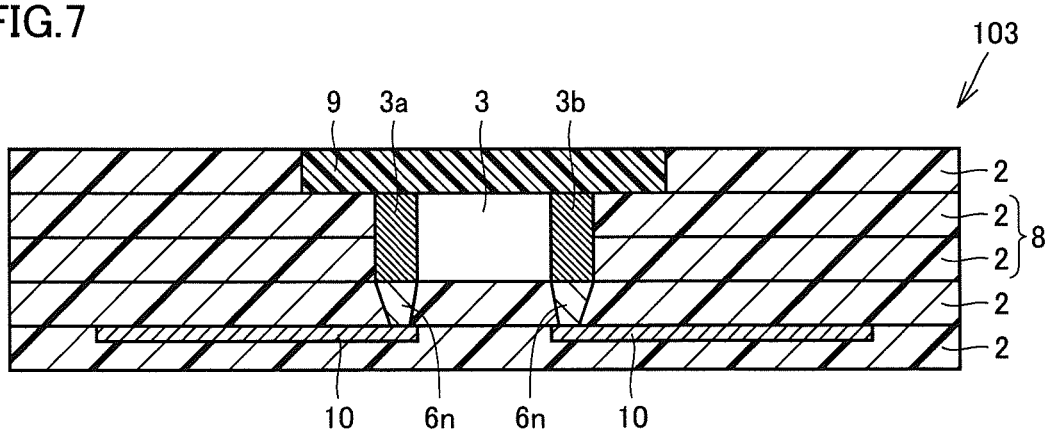
FIG. 7 is a cross sectional view of a fifth variation of the component-embedded resin substrate in Embodiment 1 in accordance with the present invention.

Further, as a variation of the component-embedded resin substrate to which the present invention is applied, a component-embedded resin substrate such as a component-embedded resin substrate 103 shown in FIG. 7 can also be provided. In component-embedded resin substrate 103, auxiliary resin portion 9 covers only the upper surface of component 3. In this example, an upper surface of auxiliary resin portion 9 has the same height as an upper surface of uppermost resin layer 2. The upper surface of auxiliary resin portion 9 is exposed to the outside. A component-embedded resin substrate having an auxiliary resin portion which is at least partially buried in resin layer 2, as with auxiliary resin portion 9 in component-embedded resin substrate 103, can suppress the peeling-off of resin layer 2 more reliably than a component-embedded resin substrate having an auxiliary resin portion whose side surface is entirely exposed to the outside, as with auxiliary resin portion 9 in component-embedded resin substrate 102.

(Embodiment 2)

Figure 8:
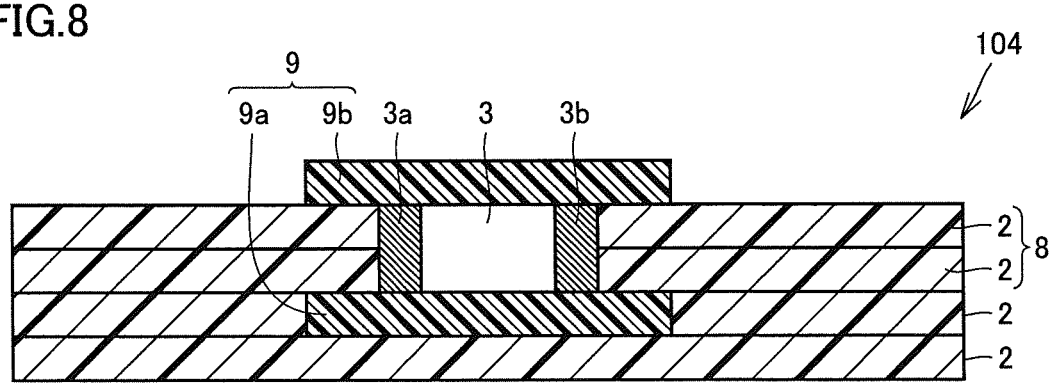
FIG. 8 is a cross sectional view of a component-embedded resin substrate in Embodiment 2 in accordance with the present invention.

A component-embedded resin substrate 104 in Embodiment 2 in accordance with the present invention will be described with reference to FIG. 8. FIG. 8 shows a cross sectional view of component-embedded resin substrate 104. In component-embedded resin substrate 104, component 3 has a second main surface parallel to the first main surface on a side opposite to the first main surface. Auxiliary resin portion 9 is arranged to further cover the second main surface. As shown in FIG. 8, auxiliary resin portion 9 includes a first portion 9a and a second portion 9b. When an upper surface of component 3 is assumed to be the first main surface, a lower surface of component 3 corresponds to the second main surface. First portion 9a of auxiliary resin portion 9 covers the second main surface of component 3, and second portion 9b of auxiliary resin portion 9 covers the first main surface of component 3. In other words, the upper and lower main surfaces of component 3 are covered with auxiliary resin portion 9, in a so-called sandwiched manner. First portion 9a and second portion 9b of auxiliary resin portion 9 each extend over a range larger than component 3.

In the present embodiment, although a side surface of component 3 is not covered with auxiliary resin portion 9, the first main surface as the upper surface of component 3 and the second main surface as the lower surface of component 3 are covered with auxiliary resin portion 9. In such a configuration, both front and rear portions which account for a particularly large percentage of the surfaces of component 3 are covered with and protected by the auxiliary resin portion, and thus a certain effect can be obtained on the problem that a resin layer peels off around the embedded component. However, it does not mean that the side surface of component 3 should not be covered in this configuration. Of the surfaces of component 3, the side surface may be covered, in addition to the first and second main surfaces. Although FIG. 8 does not show the connection of component 3, the connection may be established on the side surface of component 3, or a via conductor may be formed to penetrate auxiliary resin portion 9 and connected to a wiring pattern (not shown) formed in another resin layer 2.

Figure 9:
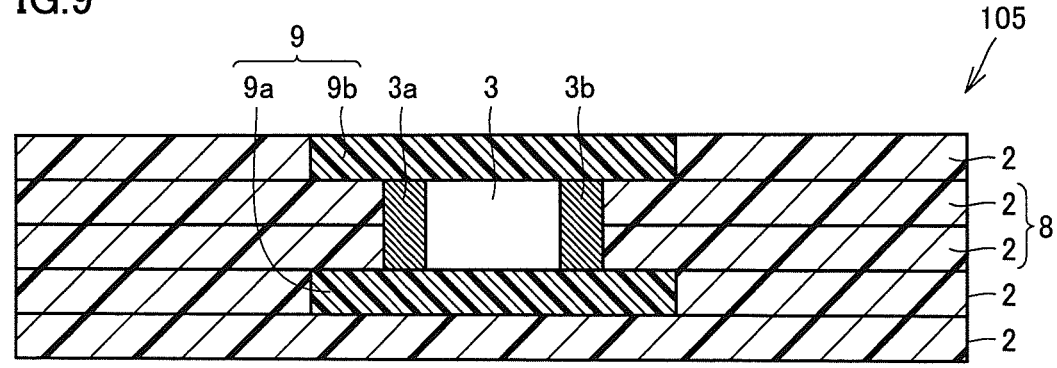
FIG. 9 is a cross sectional view of a first variation of the component-embedded resin substrate in Embodiment 2 in accordance with the present invention.

As a variation in the present embodiment, a component-embedded resin substrate such as a component-embedded resin substrate 105 shown in FIG. 9 may be provided. In component-embedded resin substrate 105, an upper surface of second portion 9b of auxiliary resin portion 9 has the same height as the upper surface of uppermost resin layer 2. The upper surface of second portion 9b is exposed to the outside.

Figure 10:
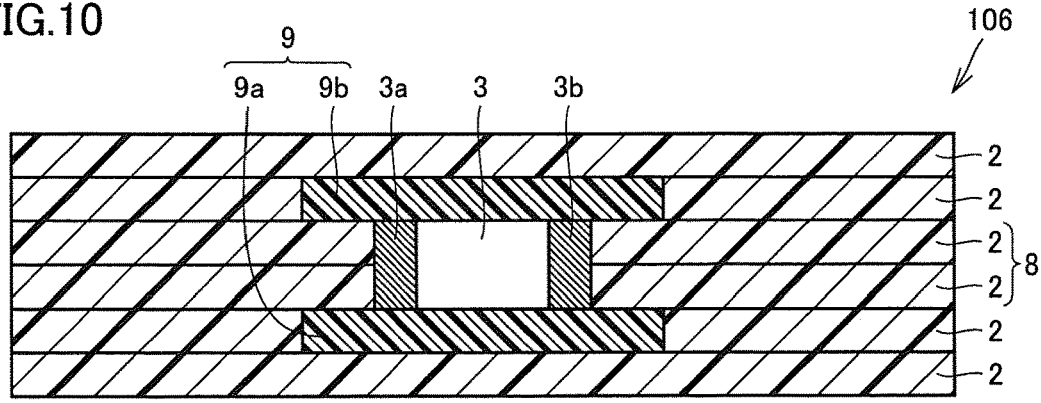
FIG. 10 is a cross sectional view of a second variation of the component-embedded resin substrate in Embodiment 2 in accordance with the present invention.

As a variation in the present embodiment, a component-embedded resin substrate such as a component-embedded resin substrate 106 shown in FIG. 10 may be provided. In component-embedded resin substrate 106, the upper surface of second portion 9b of auxiliary resin portion 9 is covered with a further upper resin layer 2. Accordingly, in this example, auxiliary resin portion 9 is not exposed to the outside at all.

(Embodiment 3)

Figure 11:
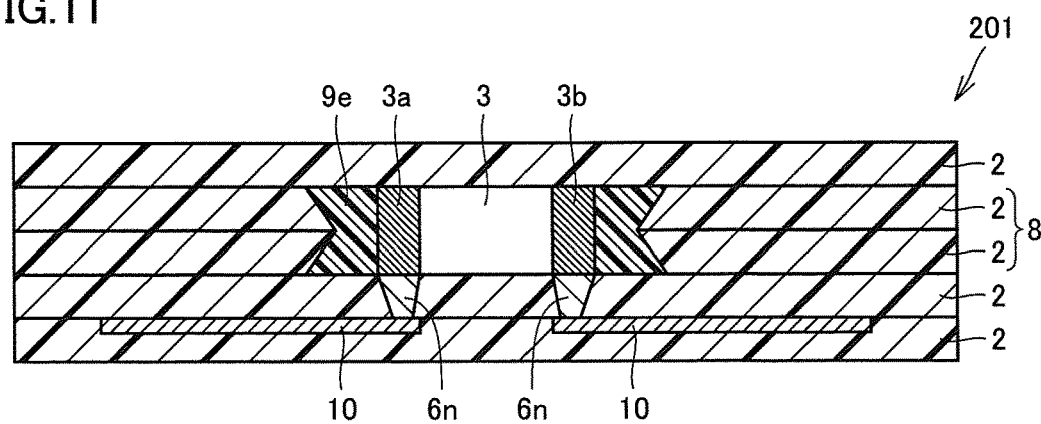
FIG. 11 is a cross sectional view of a component-embedded resin substrate in Embodiment 3 in accordance with the present invention.
Figure 12:
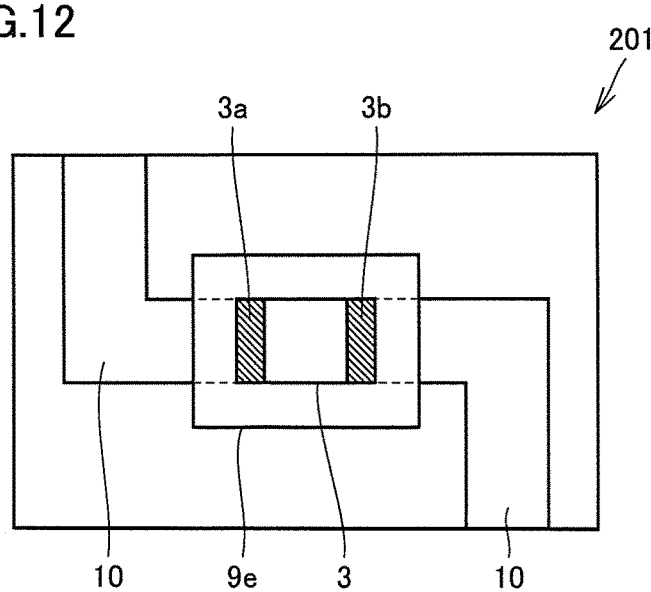
FIG. 12 is a perspective view showing a planar positional relationship among a component, an auxiliary resin portion, and a wiring pattern included in the component-embedded resin substrate in Embodiment 3 in accordance with the present invention.

A component-embedded resin substrate 201 in Embodiment 3 in accordance with the present invention will be described with reference to FIGS. 11 and 12. FIG. 11 shows a cross sectional view of component-embedded resin substrate 201 in the present embodiment. FIG. 12 shows a planar positional relationship among component 3, an auxiliary resin portion 9e, and wiring pattern 10 within component-embedded resin substrate 201. Although FIGS. 11 and 12 do not show via conductors 6 and conductive patterns 7 arranged inside, component-embedded resin substrate 201 may include via conductors 6 and conductive patterns 7 as appropriate, as in Embodiment 1. Although auxiliary resin portion 9e is arranged to surround a periphery of component 3 as seen in planar view in component-embedded resin substrate 201 in the present embodiment, auxiliary resin portion 9e may be arranged to cover only a portion of a side surface of component 3, as in Embodiment 1. Auxiliary resin portion 9e does not cover an upper surface and a lower surface of component 3, and covers only the side surface thereof. An outer side surface of auxiliary resin portion 9e has a central portion in the thickness direction which is recessed from upper and lower portions in the thickness direction. The outer side surface of auxiliary resin portion 9e is recessed to have a V shape as seen in a cross sectional view.

Also, in the present embodiment, a certain effect can be obtained on the problem that a resin layer peels off around the embedded component. Since the auxiliary resin portion does not cover the upper and lower surfaces of the component, the effect of preventing the peeling-off of a resin layer in the configuration of the present embodiment may be less than that in the configuration in which the auxiliary resin portion covers the upper and lower surfaces of the component. However, since the uncovered upper and lower surfaces can be utilized for electrical connection to the component, the configuration of the present embodiment has an advantage that the degree of freedom of wiring is increased.

Figure 13:
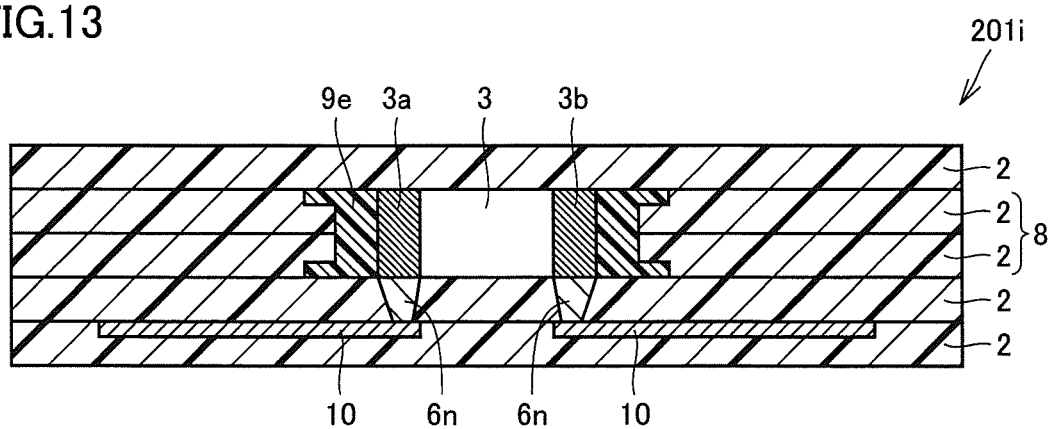
FIG. 13 is a cross sectional view of a first variation of the component-embedded resin substrate in Embodiment 3 in accordance with the present invention.

As a variation in the present embodiment, a component-embedded resin substrate such as a component-embedded resin substrate 201i shown in FIG. 13 may be provided. In component-embedded resin substrate 201i, the side surface of auxiliary resin portion 9e may be recessed to have a rectangular shape. Also in this configuration, a force applied from the component does not concentrate on an interface between adjacent resin layers and a peel force between the resin layers is less likely to be transmitted, and thus the peeling-off of a resin layer can be suppressed more effectively. Component-embedded resin substrate 201*i* is otherwise identical to component-embedded resin substrate 201 shown in FIG. 11.

Figure 14:
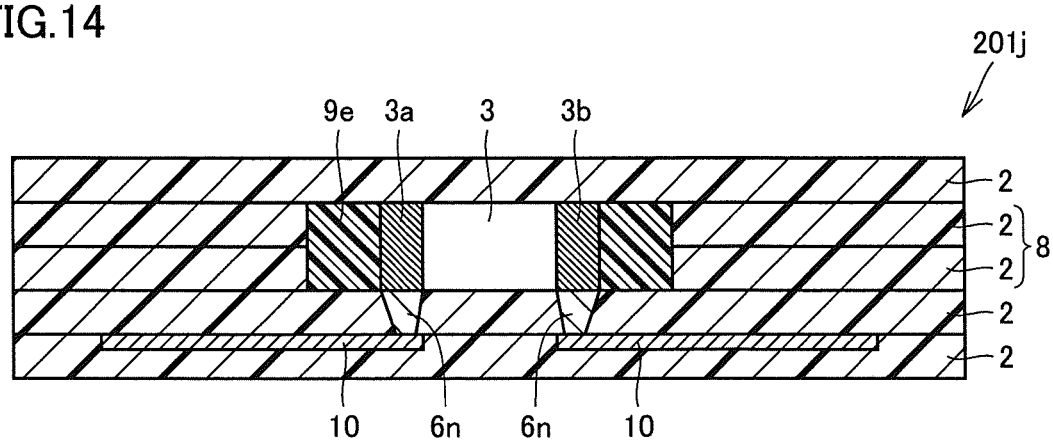
FIG. 14 is a cross sectional view of a second variation of the component-embedded resin substrate in Embodiment 3 in accordance with the present invention.

As a variation in the present embodiment, a component-embedded resin substrate such as a component-embedded resin substrate 201*j* shown in FIG. 14 may be provided. In component-embedded resin substrate 201*j*, the outer side surface of auxiliary resin portion 9*e* is not recessed. Although the effect obtained by component-embedded resin substrate 201*j* may be less than that obtained in a case where the outer side surface of auxiliary resin portion 9*e* is recessed, component-embedded resin substrate 201*j* has an advantage that it is easily fabricated because auxiliary resin portion 9*e* has a simple shape. Component-embedded resin substrate 201*j* is otherwise identical to component-embedded resin substrate 201 shown in FIG. 11.

(Embodiment 4)

A method for manufacturing a component-embedded resin substrate in Embodiment 4 in accordance with the present invention will be described with reference to FIGS. 15 to 26.

Figure 15:
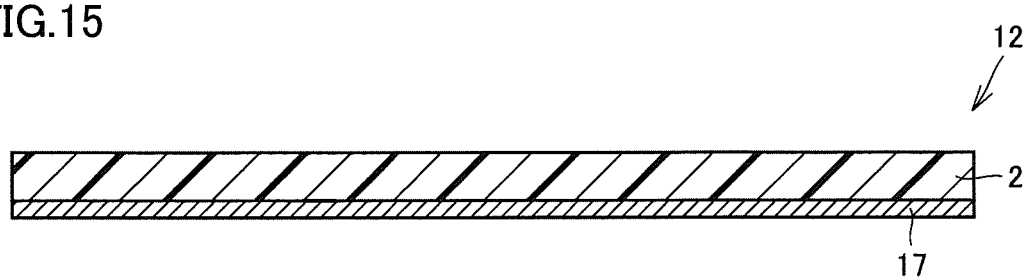
FIG. 15 is an explanatory view of a first step of a method for manufacturing a component-embedded resin substrate in Embodiment 4 in accordance with the present invention.

Firstly, a conductive foil-clad resin sheet 12 as shown in FIG. 15 is prepared. Conductive foil-clad resin sheet 12 is a sheet having a structure that conductive foil 17 adheres to one surface of resin layer 2. Resin layer 2 is made of, for example, an LCP (liquid crystal polymer) as a thermoplastic resin. The material for resin layer 2 may be PEEK (polyether ether ketone), PEI (polyetherimide), PPS (polyphenylene sulfide), PI (polyimide), or the like, other than an LCP. Conductive foil 17 is, for example, 18 µm-thick foil made of Cu. It is noted that the material for conductive foil 17 may be Ag, Al, SUS, Ni, or Au, other than Cu, or may be an alloy of two or more different metals selected from these metals. Although conductive foil 17 has a thickness of 18 µm in the present embodiment, conductive foil 17 may have a thickness of about 3 to 40 µm. Conductive foil 17 may have any thickness as long as it enables formation of a circuit.

Figure 16:
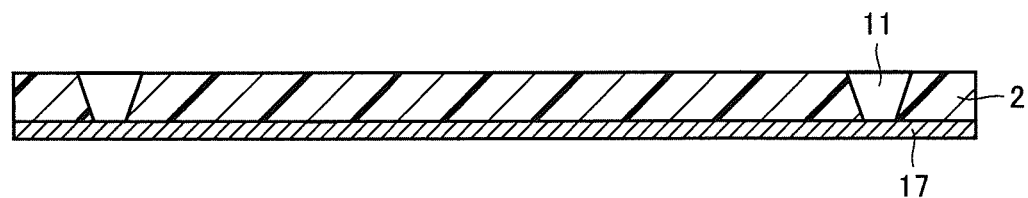
FIG. 16 is an explanatory view of a second step of the method for manufacturing the component-embedded resin substrate in Embodiment 4 in accordance with the present invention.

Next, as shown in FIG. 16, a via hole 11 is formed to penetrate resin layer 2 by emitting a carbon dioxide laser beam to a surface of conductive foil-clad resin sheet 12 having resin layer 2. Via hole 11 penetrates resin layer 2, but does not penetrate conductive foil 17. Thereafter, smear (not shown) in via hole 11 is removed. Although a carbon dioxide laser beam is used herein to form via hole 11, laser beams of other types may be used. Further, a technique other than laser beam emission may be adopted to form via hole 11.

Figure 17:
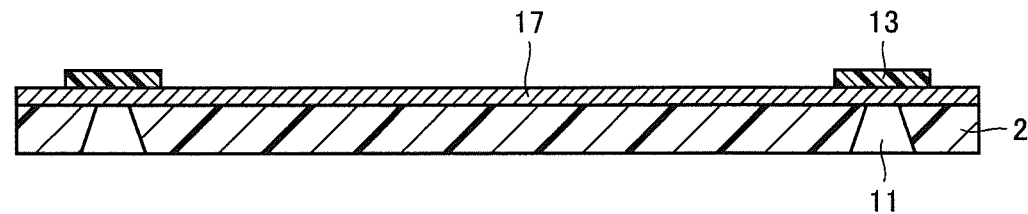
FIG. 17 is an explanatory view of a third step of the method for manufacturing the component-embedded resin substrate in Embodiment 4 in accordance with the present invention.

Next, as shown in FIG. 17, a resist pattern 13 corresponding to a desired circuit pattern is printed on a surface of conductive foil 17 of conductive foil-clad resin sheet 12, by means of a technique such as screen printing.

Figure 18:
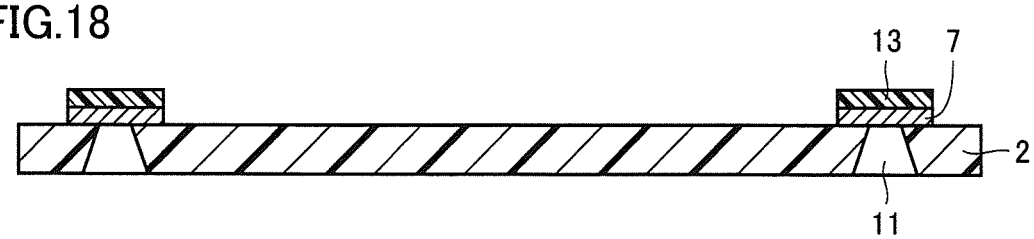
FIG. 18 is an explanatory view of a fourth step of the method for manufacturing the component-embedded resin substrate in Embodiment 4 in accordance with the present invention.
Figure 19:
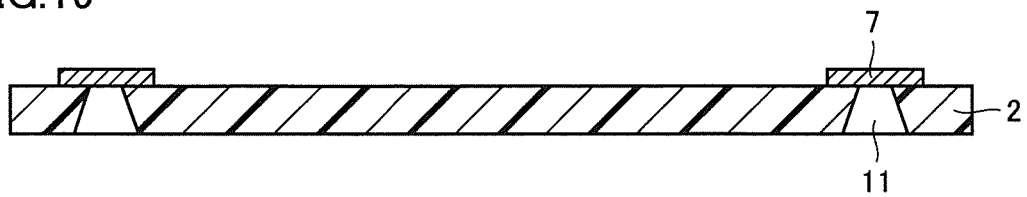
FIG. 19 is an explanatory view of a fifth step of the method for manufacturing the component-embedded resin substrate in Embodiment 4 in accordance with the present invention.

Next, etching is performed using resist pattern 13 as a mask, and a portion of conductive foil 17 not covered with resist pattern 13 is removed as shown in FIG. 18. A portion of conductive foil 17 which remains after the etching will be referred to as "conductive pattern 7". Thereafter, resist pattern 13 is removed as shown in FIG. 19. Thus, desired conductive pattern 7 is obtained on one surface of resin layer 2.

Figure 20:
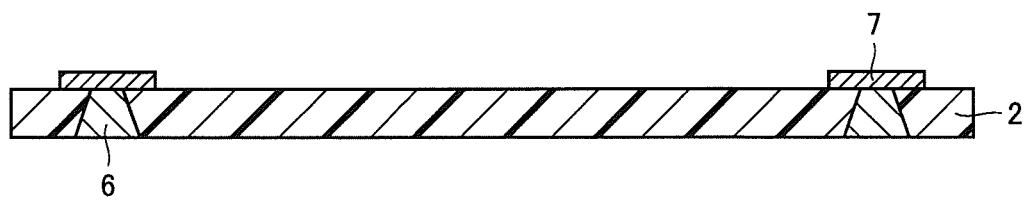
FIG. 20 is an explanatory view of a sixth step of the method for manufacturing the component-embedded resin substrate in Embodiment 4 in accordance with the present invention.

Next, as shown in FIG. 20, via hole 11 is filled with a conductive paste by means of screen printing or the like. The screen printing is performed from a lower surface in FIG. 19. Although FIGS. 19 and 20 show via hole 11 in a downward attitude for convenience of description, the screen printing may be actually performed with the attitude being changed as appropriate. The conductive paste to be charged may contain silver as a major ingredient as described above, or alternatively, may contain copper as a major ingredient. The conductive paste preferably contains an appropriate amount of metal powder which forms an alloy layer between itself and the metal as the material for conductive pattern 7 at a temperature at which laminated resin layers are thermally compression-bonded later (hereinafter referred to as a "thermal compression bonding temperature"). The conductive paste contains copper, i.e., Cu, as a major ingredient. As the conductive paste, for example, a conductive paste containing at least one of Ag, Cu, and Ni as a major ingredient and at least one of Sn, Bi, and Zn can also be used.

Figure 21:
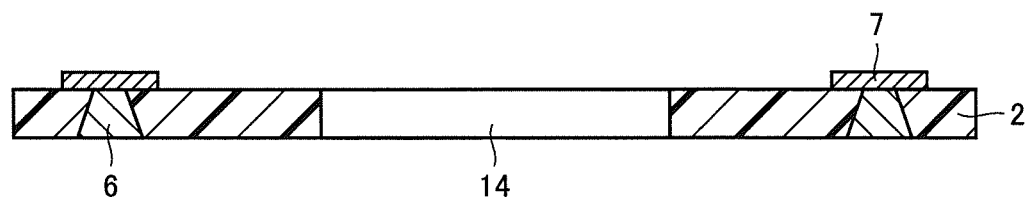
FIG. 21 is an explanatory view of a seventh step of the method for manufacturing the component-embedded resin substrate in Embodiment 4 in accordance with the present invention.

Next, as shown in FIG. 21, a through hole 14 having an area larger than a projection area of component 3 is formed in resin layer 2 by means of punching. The plurality of resin layers 2 to be laminated may include a resin layer having through hole 14 formed therein and a resin layer not having through hole 14 formed therein. Through hole 14 is formed only in resin layer 2 in which through hole 14 should be formed, of the plurality of resin layers 2, in accordance with design.

Figure 22:
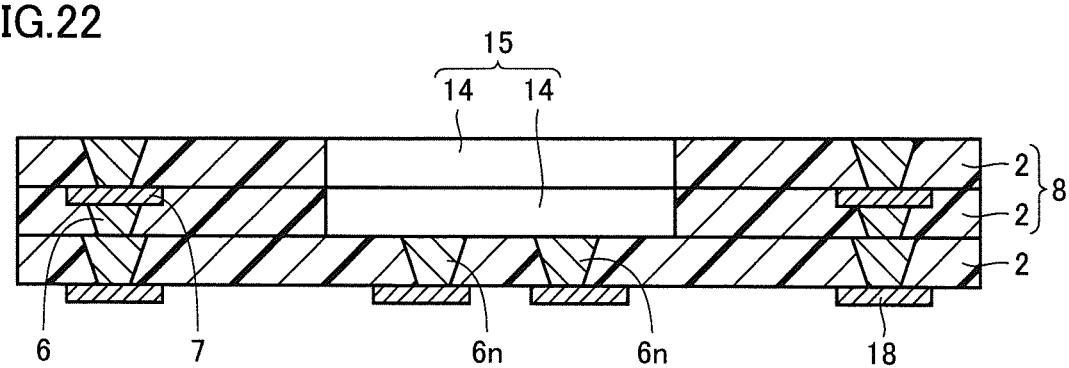
FIG. 22 is an explanatory view of an eighth step of the method for manufacturing the component-embedded resin substrate in Embodiment 4 in accordance with the present invention.

As shown in FIG. 22, the plurality of resin layers 2 are laminated to form a substrate. At the lowermost layer of the substrate, resin layer 2 is used with its surface having conductive pattern 7 formed thereon facing downward, such that conductive pattern 7 is arranged on a lower surface of the substrate. Thereby, conductive pattern 7 arranged on the lower surface of the substrate serves as an external electrode 18. In the vicinity of the lower surface of the substrate, resin layer 2 not having component accommodating hole 14 formed therein is used.

One resin layer 2 not having component accommodating hole 14 formed therein is arranged, or two resin layers 2 each not having component accommodating hole 14 formed therein are laminated. Thereafter, resin layer 2 having through hole 14 formed therein is laminated thereon. In the example shown in FIG. 22, one resin layer 2 not having through hole 14 formed therein is arranged, and thereafter two resin layers 2 each having through hole 14 formed therein are laminated thereon. A component accommodating portion 15 is formed by combining through holes 14 in two or more layers. Component accommodating portion 15 is a recessed portion having a depth enough to accommodate component 3. Also, in component-embedded resin substrate 1 shown in FIG. 3, an inner surface of the through-hole 14 has a protrusion toward the component 3, an outer surface of the auxiliary resin portion 9 fits the inner surface of the through-hole 14, and the protrusion is accepted by the recess portion of the auxiliary resin portion 9.

After resin layers 2 are laminated enough to form component accommodating portion 15, resin layers 2 are temporarily compression-bonded at a temperature lower than the thermal compression bonding temperature. The temperature for the temporary compression bonding is, for example, not less than 150° C. and not more than 200° C. By the temporary compression bonding, resin layers 2 laminated so far are bonded, and component accommodating portion 15 is formed as a stable recessed portion.

Figure 23:
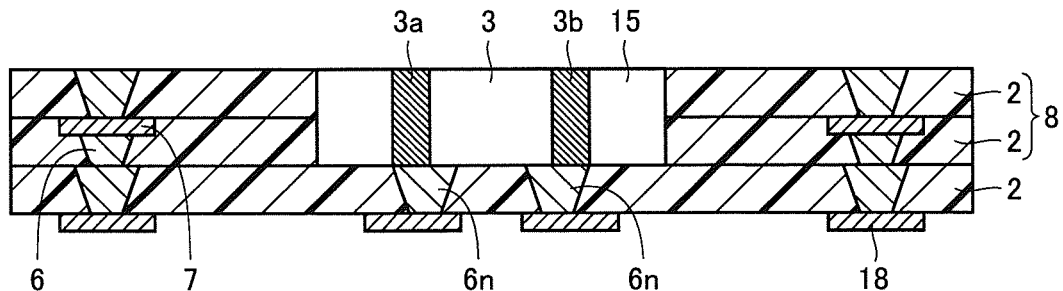
FIG. 23 is an explanatory view of a ninth step of the method for manufacturing the component-embedded resin substrate in Embodiment 4 in accordance with the present invention.

As shown in FIG. 23, component 3 is arranged within component accommodating portion 15. Preferably, component 3 is arranged to be apart from any of side walls of component accommodating portion 15. Particularly preferably, component 3 is arranged in the vicinity of the center of component accommodating portion 15.

Figure 24:
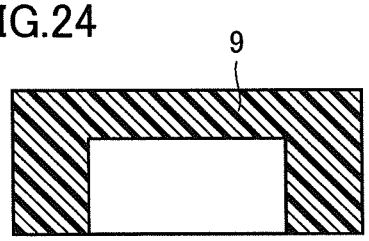
FIG. 24 is a cross sectional view of an auxiliary resin portion used in the method for manufacturing the component-embedded resin substrate in Embodiment 4 in accordance with the present invention.

Auxiliary resin portion 9 as shown in FIG. 24 is separately prepared in advance. In this example, auxiliary resin portion 9 has a shape of a cap. Auxiliary resin portion 9 is preferably formed of a resin which is harder than resin layer 2. In other words, auxiliary resin portion 9 is preferably formed of a resin having a Young's modulus higher than that of resin layer 2.

It is noted that, as the material for auxiliary resin portion 9, a resin having a Young's modulus higher than that of resin layer 2 prepared by mixing, for example, a filler into a resin which can be used as the material for resin layer 2 can be used. Therefore, the main resin material for auxiliary resin portion 9 may be identical to the main resin material for resin layer 2. Further, a crosslinking resin such as PABI (polyaminobismaleimide), PAZ (polytriazine), or PAI (polyamide-imide) may be used.

Figure 25:
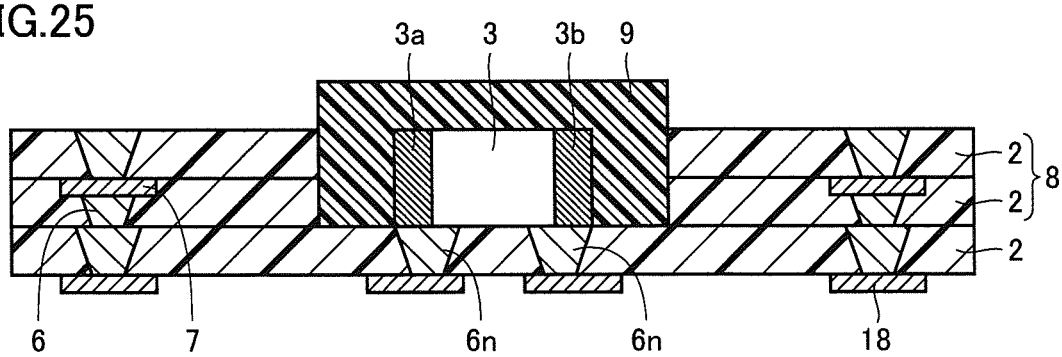
FIG. 25 is an explanatory view of a tenth step of the method for manufacturing the component-embedded resin substrate in Embodiment 4 in accordance with the present invention.

As shown in FIG. 25, auxiliary resin portion 9 is fitted into component accommodating portion 15. A portion of auxiliary resin portion 9 is inserted into component accommodating portion 15, and the other portion of auxiliary resin portion 9 protrudes upward.

Figure 26:
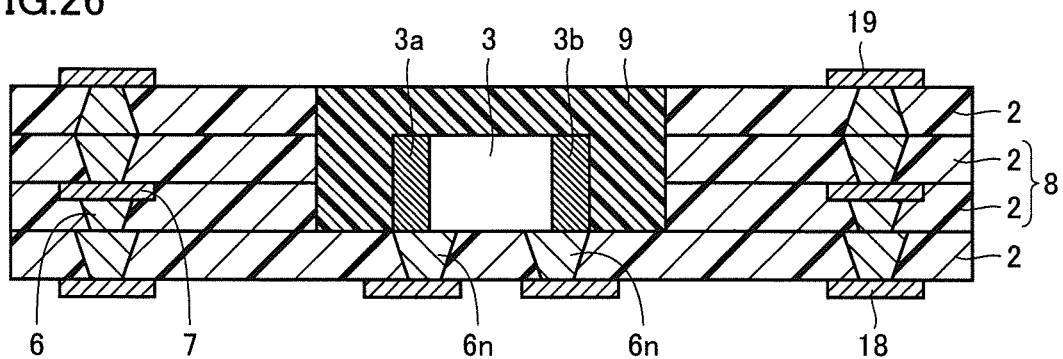
FIG. 26 is an explanatory view of an eleventh step of the method for manufacturing the component-embedded resin substrate in Embodiment 4 in accordance with the present invention, and is a cross sectional view of the component-embedded resin substrate obtained by the manufacturing method.

Next, as shown in FIG. 26, resin layer 2 is further arranged above component 3. This resin layer 2 has a through hole corresponding to auxiliary resin portion 9. An upper surface of auxiliary resin portion 9 is exposed in an upper surface of the substrate. The upper surface of auxiliary resin portion 9 has the same height as the upper surface of uppermost resin layer 2. Conductive pattern 7 formed on uppermost resin layer 2 of the substrate serves as an external electrode 19 for mounting another IC component or the like. Although only one more resin layer 2 is laminated in the example shown in FIG. 26 when compared with the configuration in FIG. 25, not only one layer but also two or more layers may be laminated.

Next, this laminated body is permanently compression-bonded. In the step of the permanent compression bonding, the laminated body which has already been temporarily compression-bonded and resin layer 2 laminated after the temporary compression bonding are all thermally compression-bonded together. The temperature for the permanent compression bonding is, for example, not less than 250° C. and not more than 300° C. The "thermal compression bonding temperature" described above refers to the temperature for this permanent compression bonding. By the permanent compression bonding, resin layers 2 adjacent in the thickness direction are bonded with one another to form an integral insulating base material. When the material for resin layer 2 is a thermoplastic resin, the material for resin layer 2 softens and flows by the thermal compression bonding, and thus a gap around component 3 is filled by the flow of the material for surrounding resin layers 2. After the permanent compression bonding is finished, plating with Ni, Au, or the like is preferably performed on surfaces of external electrodes 18, 19 formed on upper and lower surfaces of a component-embedded resin substrate.

Thus, the component-embedded resin substrate having a structure shown in FIG. 26 is obtained.

In other words, the method for manufacturing the component-embedded resin substrate in the present embodiment includes the steps of: preparing a plurality of resin layers made of a first resin; forming a through hole for accommodating a component in some of the plurality of resin layers; arranging the component in the through hole; arranging an auxiliary resin portion made of a second resin different from the first resin to be in contact with and along at least one of surfaces of the component; laminating the plurality of resin layers; and thermally compression-bonding the laminated plurality of resin layers. The step of arranging the component in the through hole and the step of arranging the auxiliary resin portion made of the second resin different from the first resin to be in contact with and along at least one of the surfaces of the component are not necessarily performed in this order, and these steps may be performed simultaneously in parallel. The step of laminating the plurality of resin layers and the step of arranging the auxiliary resin portion are not necessarily performed in this order. The step of arranging the auxiliary resin portion may interrupt the step of laminating the plurality of resin layers and may be performed, and thereafter the rest of the step of laminating the plurality of resin layers may be performed. Alternatively, the step of arranging the auxiliary resin portion may be performed after the step of laminating the plurality of resin layers is completed. Alternatively, the step of laminating the plurality of resin layers may be started after the step of arranging the auxiliary resin portion is performed.

By using the manufacturing method in the present embodiment, the component-embedded resin substrates described in Embodiments 1 to 3 can be easily obtained. That is, since the component-embedded resin substrate is manufactured such that the auxiliary resin portion made of the second resin different from the first resin is arranged to be in contact with and along at least one of the surfaces of the component, a component-embedded resin substrate which can alleviate the problem that a resin layer peels off around an embedded component even when the substrate itself is deformed can be obtained.

Figure 27:
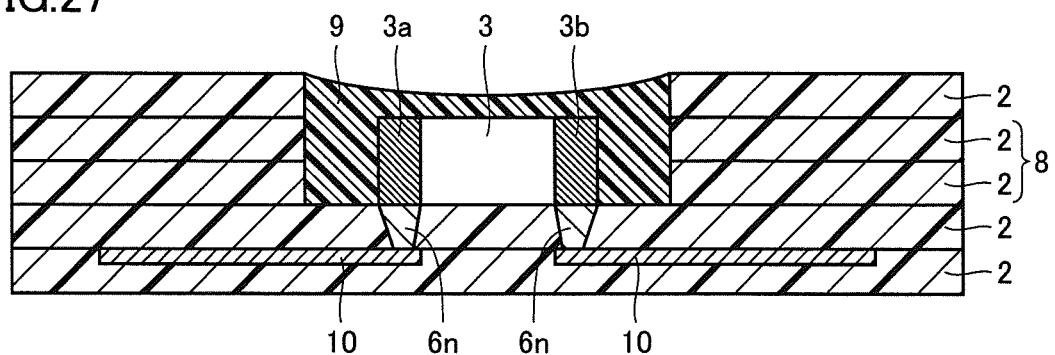
FIG. 27 is a cross sectional view of a first variation of the component-embedded resin substrate obtained by the method for manufacturing the component-embedded resin substrate in Embodiment 4 in accordance with the present invention.
Figure 28:
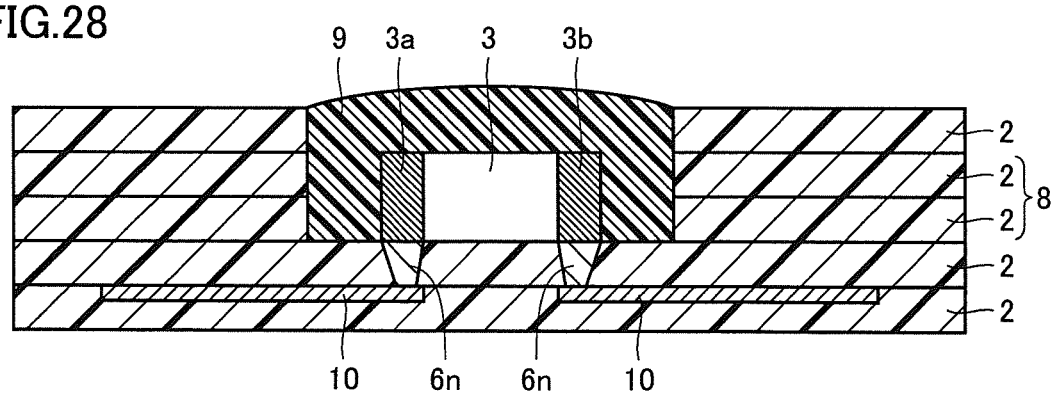
FIG. 28 is a cross sectional view of a second variation of the component-embedded resin substrate obtained by the method for manufacturing the component-embedded resin substrate in Embodiment 4 in accordance with the present invention.

Although auxiliary resin portion 9 produced in advance as an independent component is fitted in the present embodiment, auxiliary resin portion 9 may be formed by filling a gap within component accommodating portion 15 with a paste resin or a liquid resin. In that case, the upper surface of auxiliary resin portion 9 may be recessed as shown in FIG. 27 as a result of the permanent compression bonding. Conversely, the upper surface of auxiliary resin portion 9 may be expanded as shown in FIG. 28 as a result of the permanent compression bonding.

Preferably, in the method for manufacturing the component-embedded resin substrate in the present embodiment, the second resin has a Young's modulus higher than that of the first resin, because, when the component-embedded resin substrate is manufactured to satisfy this condition, the auxiliary resin portion contributes to an increase in stiffness around a periphery of the component, and thus an excessively large bending in the surfaces of the component can be avoided, and the peeling-off, which has conventionally been problematic, is less likely to occur.

Preferably, in the method for manufacturing the component-embedded resin substrate in the present embodiment, in the step of arranging the auxiliary resin portion, the auxiliary resin portion is arranged to cover a side surface of the component. When the component-embedded resin substrate is manufactured to satisfy this condition, the auxiliary resin portion can receive a force applied from the side of the component, and thus the probability of occurrence of the problem that a resin layer peels off around the embedded component can be reduced more effectively.

Preferably, in the method for manufacturing the component-embedded resin substrate in the present embodiment, in the step of arranging the auxiliary resin portion, the auxiliary resin portion is arranged to surround a periphery of the component as seen in planar view. When the component-embedded resin substrate is manufactured to satisfy this condition, the auxiliary resin portion covers any of the sides of the component as seen in planar view, and thus stiffness around the periphery of the component can be increased more reliably.

Preferably, in the method for manufacturing the component-embedded resin substrate in the present embodiment, the component has a first main surface parallel to surfaces of the resin layers, and the auxiliary resin portion is arranged to cover the first main surface of the component. When the component-embedded resin substrate is manufactured to satisfy this condition, the auxiliary resin portion can receive a force acting on the component more reliably.

Preferably, in the method for manufacturing the component-embedded resin substrate in the present embodiment, the component has a second main surface parallel to the first main surface on a side opposite to the first main surface, and the auxiliary resin portion is arranged to further cover the second main surface. When the component-embedded resin substrate is manufactured to satisfy this condition, of the surfaces of the component, both front and rear portions which account for a particularly large percentage are covered with and protected by the auxiliary resin portion, and thus a certain effect can be obtained on the problem that a resin layer peels off around the embedded component.

Preferably, in the method for manufacturing the component-embedded resin substrate in the present embodiment, the auxiliary resin portion is prepared to have a shape of a cap surrounding an upper surface and a periphery of the component, and the manufacturing method includes the step of arranging the auxiliary resin portion to cover the upper surface and the periphery of the component. When the component-embedded resin substrate is manufactured to satisfy this condition, stiffness around the periphery of the component can be increased more reliably, and thus the peeling-off of a resin layer can be suppressed.

Preferably, in the method for manufacturing the component-embedded resin substrate in the present embodiment, the auxiliary resin portion is arranged to cover a side surface of the component, and, in a portion where the auxiliary resin portion covers the side surface, the auxiliary resin portion is arranged such that an outer side surface of the auxiliary resin portion has a central portion in the thickness direction which is recessed from upper and lower portions in the thickness direction. When the component-embedded resin substrate is manufactured to satisfy this condition, the peeling-off of a resin layer can be suppressed more effectively.

Preferably, in the method for manufacturing the component-embedded resin substrate in the present embodiment, the first resin is a thermoplastic resin, and the second resin is a thermosetting resin, and the method includes the step of performing heat treatment for hardening the second resin after finishing both the step of arranging the component and the step of arranging the auxiliary resin portion. When the component-embedded resin substrate is manufactured to satisfy this condition, in the step of thermally compression-bonding the laminated plurality of resin layers, the second resin arranged on the periphery of the component has already been hardened. Therefore, since the second resin serves as a hard wall for protecting the component, the effect that the component is less likely to be damaged can be obtained more significantly. As the second resin, for example, an epoxy resin can be used.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

The present invention is applicable to a component-embedded resin substrate and a method for manufacturing the same.

1, 1*i*, 1*j*, 101, 102, 103, 104, 105, 106, 201, 201*i*, 201*j*: component-embedded resin substrate; 2: resin layer; 3: component; 3*a*, 3*b*: electrode (of the component); 4: interface (between an insulating layer and the component); 5: interface (between insulating layers); 6, 6*n*: via conductor; 7: conductive pattern; 8: first group; 9, 9*e*: auxiliary resin portion; 9*a*: first portion; 9*b*: second portion; 10: wiring pattern; 11: via hole; 12: conductive foil-clad resin sheet; 13: resist pattern; 14: through hole; 15: component accommodating portion; 17: conductive foil (before patterning); 18, 19: external electrode; 901: (conventional) component-embedded resin substrate.

The invention claimed is:
1. A component-embedded resin substrate, comprising:
a plurality of resin layers laminated on one another, each of said plurality of resin layers including a first resin;
a component surrounded by a first group of two or more resin layers of said plurality of resin layers, said first group of two or more resin layers being arranged successively in a thickness direction; and
an auxiliary resin portion including a second resin different from said first resin, said auxiliary resin portion being in contact with and along at least one of surfaces of said component,
wherein said auxiliary resin portion has a shape surrounding an upper surface and a periphery of said component,
wherein said auxiliary resin portion covers a side surface of said component, and an outer lateral side surface of said auxiliary resin portion is recessed in a central portion of said outer lateral side surface in the thickness direction from both upper and lower portions of said outer lateral side surface in the thickness direction,
wherein a length of the recess portion in the thickness direction is smaller than a thickness of the component,
wherein the recess portion is located below a top surface of the component in the thickness direction, and
wherein the first group of two or more resin layers has a through-hole, the component is located in the through-hole, an inner surface of the through-hole has a protrusion toward the component, an outer surface of the auxiliary resin portion fits the inner surface of the through-hole, and the protrusion is accepted by the recess portion of the auxiliary resin portion.

2. The component-embedded resin substrate according to claim 1, wherein said second resin has a Young's modulus higher than that of said first resin.

3. The component-embedded resin substrate according to claim 1, wherein said auxiliary resin portion extends along all of said first group of two or more resin layers in the thickness direction.

4. The component-embedded resin substrate according to claim 1, wherein said auxiliary resin portion includes a portion surrounding a periphery of said component as seen in planar view.

5. The component-embedded resin substrate according to claim 1, wherein said component has a first main surface parallel to surfaces of said plurality of resin layers, and said auxiliary resin portion covers said first main surface of said component.

6. The component-embedded resin substrate according to claim 5, wherein said component has a second main surface parallel to said first main surface on a side opposite to said first main surface, and said auxiliary resin portion further covers said second main surface.

7. The component-embedded resin substrate according to claim 1, wherein said first resin is a thermoplastic resin, and said second resin is a thermosetting resin.

8. The component-embedded resin substrate according to claim 1, wherein an upper surface of said auxiliary resin portion in the thickness direction is exposed from said substrate.

9. The component-embedded resin substrate according to claim 1, wherein all of outer side surfaces of said auxiliary resin portion in a direction perpendicular to the thickness direction are completely covered with said plurality of resin layers and are not exposed to the outside from said substrate.

10. A method for manufacturing the component-embedded resin substrate according to claim 1, comprising the steps of:
providing a plurality of resin layers, each of said plurality of resin layers including a first resin;
arranging a first group of two or more resin layers of said plurality of resin layers successively in a thickness direction so that a component is surrounded by said first group of two or more resin layers;
arranging an auxiliary resin portion including a second resin different from said first resin to be in contact with and along at least one of surfaces of said component; and
laminating said plurality of resin layers,
wherein said auxiliary resin portion covers a side surface of said component, and an outer lateral side surface of said auxiliary resin portion is recessed in a central portion of said outer lateral side surface in the thickness direction from both upper and lower portions of said outer lateral side surface in the thickness direction, and
wherein a length of the recess portion in the thickness direction is smaller than a thickness of the component.

11. The method for manufacturing the component-embedded resin substrate according to claim 10, wherein said second resin has a Young's modulus higher than that of said first resin.

12. The method for manufacturing the component-embedded resin substrate according to claim 10, wherein, in the step of arranging said auxiliary resin portion, said auxiliary resin portion covers a side surface of said component.

13. The method for manufacturing the component-embedded resin substrate according to claim 10, wherein, in the step of arranging said auxiliary resin portion, said auxiliary resin portion surrounds a periphery of said component as seen in planar view.

14. The method for manufacturing the component-embedded resin substrate according to claim 10, wherein said component has a first main surface parallel to surfaces of said plurality of resin layers, and said auxiliary resin portion covers said first main surface of said component.

15. The method for manufacturing the component-embedded resin substrate according to claim 14, wherein said component has a second main surface parallel to said first main surface on a side opposite to said first main surface, and said auxiliary resin portion further covers said second main surface.

16. The method for manufacturing the component-embedded resin substrate according to claim 10, wherein
said auxiliary resin portion has a cap-shape surrounding an upper surface and a periphery of said component, and
the method further comprises a step of arranging said auxiliary resin portion to cover the upper surface and the periphery of said component.

17. The method for manufacturing the component-embedded resin substrate according to claim 10, wherein said auxiliary resin portion covers a side surface of said component, and a portion of said auxiliary resin portion covering said side surface has an outer side surface recessed in a central portion in the thickness direction from upper and lower portions in the thickness direction.

18. The method for manufacturing the component-embedded resin substrate according to claim 10, wherein
said first resin is a thermoplastic resin, and said second resin is a thermosetting resin, and
the method further comprises a step of performing heat treatment for hardening said second resin after finishing both the step of arranging said component and the step of arranging said auxiliary resin portion.

19. A component-embedded resin substrate, comprising:
a plurality of resin layers laminated on one another, each of said plurality of resin layers including a first resin;
a component surrounded by a first group of two or more resin layers of said plurality of resin layers, said first group of two or more resin layers being arranged successively in a thickness direction; and
an auxiliary resin portion including a second resin different from said first resin, said auxiliary resin portion being in contact with and along at least one of surfaces of said component,
wherein said auxiliary resin portion has a shape surrounding an upper surface and a periphery of said component,
wherein said auxiliary resin portion covers a side surface of said component, and an outer lateral side surface of said auxiliary resin portion is recessed in a central portion of said outer lateral side surface in the thickness direction from both upper and lower portions of said outer lateral side surface in the thickness direction,
wherein said auxiliary resin portion covers all but a bottom surface of said component,
wherein the recess portion is located below a top surface of the component in the thickness direction, and
wherein the first group of two or more resin layers has a through-hole, the component is located in the through-hole, an inner surface of the through-hole has a protrusion toward the component, an outer surface of the auxiliary resin portion fits the inner surface of the through-hole, and the protrusion is accepted by the recess portion of the auxiliary resin portion.

* * * * *